United States Patent
Son et al.

(10) Patent No.: US 7,477,550 B2
(45) Date of Patent: Jan. 13, 2009

(54) NAND FLASH MEMORY DEVICE AND METHOD OF IMPROVING CHARACTERISTIC OF A CELL IN THE SAME

(75) Inventors: Ji Hye Son, Seoul (KR); Jun Seop Jung, Seongnam-si (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 65 days.

(21) Appl. No.: 11/751,014

(22) Filed: May 19, 2007

(65) Prior Publication Data

US 2008/0175063 A1    Jul. 24, 2008

(30) Foreign Application Priority Data

Jan. 23, 2007    (KR) ................... 2007-7051

(51) Int. Cl.
*G11C 16/06* (2006.01)
(52) U.S. Cl. .............. 365/185.22; 365/185.12; 365/185.17; 365/185.18
(58) Field of Classification Search ........... 365/185.12, 365/185.17, 185.18, 185.2, 185.22, 185.24, 365/185.09, 189.05
See application file for complete search history.

(56) References Cited

U.S. PATENT DOCUMENTS

| | | | |
|---|---|---|---|
| 5,299,162 A * | 3/1994 | Kim et al. | 365/185.17 |
| 6,813,184 B2 * | 11/2004 | Lee | 365/185.09 |
| 7,269,064 B2 * | 9/2007 | Kim | 365/185.12 |
| 2001/0014037 A1 * | 8/2001 | Kim et al. | 365/185.18 |

FOREIGN PATENT DOCUMENTS

| | | | |
|---|---|---|---|
| KR | 1020060002245 A | | 1/2006 |
| KR | 1020060044239 A | | 5/2006 |
| KR | 1020060067380 A | | 6/2006 |
| KR | 1020060070734 A | | 6/2006 |
| KR | 1020060070947 A | | 6/2006 |
| KR | 1020060073293 A | | 6/2006 |

* cited by examiner

*Primary Examiner*—Gene N. Auduong
(74) *Attorney, Agent, or Firm*—Townsend and Townsend and Crew LLP (57) ABSTRACT

A non-volatile memory device includes a memory cell array, a page buffer, a cell characteristic detecting circuit, an X decoder and a Y decoder. The memory cell array has memory cells coupled to bit lines and word lines. The page buffer programs data to a selected memory cell or read data from the selected memory cell. The cell characteristic detecting circuit is coupled to a sensing node of the page buffer, and outputs a controlling signal in accordance with a distribution state of the memory cell using a read voltage and a program voltage about the selected memory cell. The X decoder selects a word line of the memory cell array in accordance with an inputted address. The Y decoder provides a path for inputting/outputting data in the selected memory cell. Here, the selected memory cell is programmed by using the program voltage corresponding to a program verifying voltage in accordance with the controlling signal outputted from the cell characteristic verifying circuit.

19 Claims, 5 Drawing Sheets

NAND FLASH MEMORY DEVICE AND METHOD OF IMPROVING CHARACTERISTIC OF A CELL IN THE SAME

CROSS-REFERENCE TO RELATED APPLICATIONS

This application claims priority from Korean Patent Application No. 2007-7051, filed on Jan. 23, 2007, the contents of which are incorporated herein by reference in its entirety.

BACKGROUND OF THE INVENTION

The present invention relates to a flash memory device, and more particularly, to a method for improving the cell distribution characteristics of a non-volatile memory device (e.g., NAND flash memory device).

A flash memory device includes memory cells connected in series by adjacent memory cells sharing a source and drain. In this case, the string of memory cells is connected to a bit line. The memory cell is a transistor with a floating gate and a control gate.

A drain of the memory cell is connected to the bit line through a select gate, and a source of the memory cell is connected to a source line through a select gate. In addition, the control gates of the memory cells are disposed in sequence across the cell strings, and so a word line is formed.

Hereinafter, an operation of this NAND flash memory device will be described in detail.

An operation of writing data is performed in sequence from a memory cell that is provided farthest from the bit line.

A high voltage Vpp is applied to a control gate of a selected memory cell, and a medium voltage is applied to a control gate and a select gate of a memory cell located at the side of the bit line. Additionally, 0V or the medium voltage is applied to the bit line in accordance with a program data.

When 0V is applied to the bit line, the voltage of 0V is provided to the drain of the selected memory cell, and so electrons are injected from the drain to the floating gate. As a result, a threshold value of the selected memory cell is shift in a positive direction.

Further, an erase is performed simultaneously in every memory cells in the same block of the NAND flash memory device. That is, a high voltage is applied to the P-type well and the N-type substrate under the condition that 0V is applied to every control gate and select gate, and the bit line and the source line are in a floating state. As a result, for the memory cells in the block, electrons in the floating gates are emitted to the P-type well, and so the critical value is shift in a negative direction.

An operation of reading data is performed by detecting whether or not current is passed through the selected memory cell when 0V is applied to the control gate of the selected memory cell and a power supply voltage is provided to a control gate and a select gate of the other memory cells.

Figure 1:
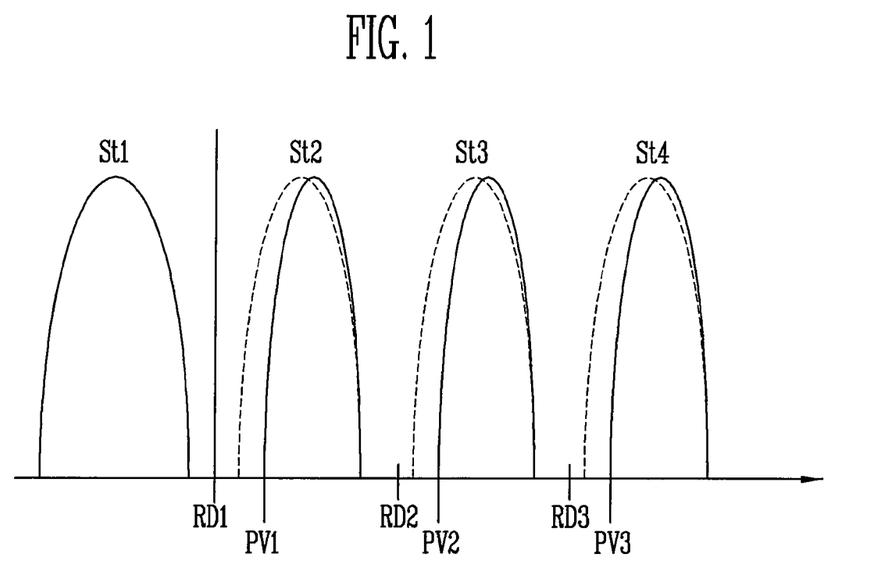
FIG. 1 is a view illustrating common cell distribution characteristics in a multi-level cell.
Figure 2:
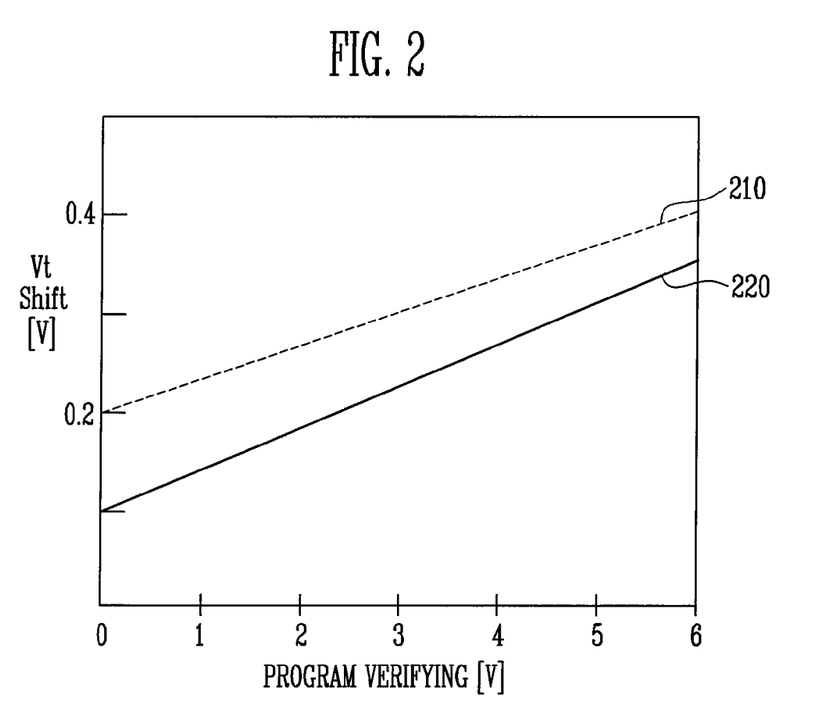
FIG. 2 is a view illustrating the change of threshold voltage of a cell in relation to the increase of a program voltage.

FIG. 1 is a view illustrating common cell distribution characteristics. FIG. 2 is a view illustrating the change of threshold voltage of a cell in accordance with the increase of a program voltage.

FIG. 1 shows the cell distribution characteristic of a multilevel cell for storing data of 2 bits. Here, the cell distributions are separated into a first state St1 (not programmed) and second to fourth states St2 to St4 (programmed).

Generally, the first state St1 is assigned to data '00', the second state St2 to data '01', the third state St3 to data '11', and the fourth state St4 to data '10'.

Read voltages RD1, RD2 and RD3 are applied so as to read data in accordance with each of the cell distributions, and verifying voltages PV1, PV2 and PV3 are applied when a program verify is performed.

A shift phenomenon can occur in the multi-level cell flash memory device having the above cell distributions if it performs in sequence a program operation, a read operation and an erase operation. As a result, the threshold voltages may be changed as shown in the dotted line of FIG. 1.

This phenomenon is referred to as a "cell voltage shift phenomenon" or "threshold voltage shift phenomenon". Data integrity becomes low in a case where the memory cell is maintained at a data program state for a long time, and so the cell distribution becomes wide. In particular, cell characteristics of cells having bad program characteristics is deteriorated.

As shown in FIG. 2, the cell voltage shift phenomenon increases as a program verify voltage level is increased. The cell voltage shift phenomenon also increases when an operation cycle is increased. An operation cycle of a dotted line 220 is longer than an operation cycle of a solid line 210. Accordingly, to program these cells, a higher voltage would be required, and the duration of a program time would need to be increased.

SUMMARY OF THE INVENTION

An embodiment of the present invention provides a non-volatile memory device (e.g., NAND flash memory device) for improving a cell distribution characteristic in the case that a cell voltage shift phenomenon has occurred by correcting the voltage shift.

A NAND flash memory device according to one example embodiment of the present invention includes a memory cell array, a page buffer, a cell characteristic detecting circuit, an X decoder and a Y decoder. The memory cell array has memory cells coupled to a pair of bit lines and word lines. The page buffer programs data to a selected memory cell or read data from the selected memory cell. The cell characteristic detecting circuit is coupled to a sensing node of the page buffer, and outputs a controlling signal in accordance with a distribution state of the memory cell using a read voltage and a program voltage about the selected memory cell. The X decoder selects a word line of the memory cell array in accordance with an inputted address. The Y decoder provides a path for inputting/outputting data in the selected memory cell. Here, the selected memory cell is programmed by using the program voltage corresponding to a program verifying voltage in accordance with the controlling signal outputted from the cell characteristic verifying circuit.

The cell characteristic verifying circuit discriminates whether or not the memory cell is normally programmed by using the read voltage and the program verifying voltage in accordance with a level state of the memory cell. The cell characteristic detecting circuit operates periodically.

The cell characteristic detecting circuit operates after the NAND flash memory device is baked.

The cell characteristic detecting circuit includes a first transistor configured to read data coupled to the sensing node by the read voltage; a second transistor configured to read data coupled to the sensing node in accordance with the program verifying voltage; and a latch circuit configured to perform a latch operation in accordance with a state of data in the memory cell coupled to the sensing node through the first transistor and the second transistor.

The latch circuit includes a first inverter and a second inverter coupled between a first node and a second node, a voltage level of the second node being outputted as the controlling signal.

The first transistor is coupled between the first node and a third node, and the second transistor is coupled between the second node and the third node. In this case, the cell characteristic detecting circuit further includes a third transistor coupled between the third node and a ground voltage, and configured to operate in accordance with a voltage level of the sensing node.

A corresponding memory cell is again programmed in case that the corresponding memory cell is programmed on the basis of the read voltage and is not programmed on the basis of the program verifying voltage in accordance with the controlling signal outputted from the cell characteristic verifying circuit.

A NAND flash memory device according to another example embodiment of the present invention includes a memory cell array, a page buffer, an X decoder and a Y decoder. The memory cell array has memory cells coupled to a pair of bit lines and word lines. The page buffer has a first latch section and a second latch section for sensing a voltage of a sensing node in response to a read controlling signal, stores and outputs the sensed data, or stores inputted data and outputs the store data through the sensing node, and discriminates a program state of a cell in accordance with a controlling signal. The X decoder selects a word line related to the memory cell array in accordance with an inputted address. The Y decoder provides a path for inputting/outputting data in a selected memory cell. Here, a most significant bit register or a least significant bit register of the page buffer detects characteristic of the cell in accordance with a cell characteristic refresh command, and outputs a signal in accordance with the detection result.

The first latch section or the second latch section includes a latch circuit coupled between a first node and a second node; a first transistor coupled between the first node and a third node, and configured to read data coupled to a sensing node in accordance with a read voltage; a second transistor coupled between the second node and the third node, and configured to read data coupled to the sensing node in accordance with a program verifying voltage; a third transistor coupled between the third node and a ground voltage, and configured to operate in accordance with a voltage level of the sensing node; and a fourth transistor configured to output a cell characteristic detecting signal in accordance with a voltage level of the second node.

The first latch section further includes a data inputting circuit coupled to the first node and the second node, and configured to perform an operation of inputting data; and an outputting circuit configured to output the data stored in the latch circuit to the sensing node.

The second latch section further includes an outputting circuit configured to output data stored in the latch circuit to the sensing node.

The page buffer further includes a bit line selecting circuit configured to select a bit line in accordance with the inputted address; a comparing circuit configured to discriminate whether or not a corresponding cell is programmed by comparing the data of the first latch section with the data of the second latch section, and perform a program operation about data in accordance with the discrimination result; and a precharge circuit configured to precharge the sensing node.

A method of improving characteristic of a cell in a NAND flash memory device according to one example embodiment of the present invention includes receiving a cell voltage refresh command; discriminating a state of a selected cell in accordance with a read voltage and a verifying voltage; and performing selectively a re-programming operation about the selected cell in accordance with the discrimination result.

The state of the cell includes a first state that a certain cell is not programmed about the read voltage; a second state that a certain cell is programmed about the read voltage, and is not programmed about the verifying voltage; and a third state that a certain cell is programmed about the read voltage and the verifying voltage.

The cell having the second state is again programmed.

The cell having the second state is again programmed using the verifying voltage.

The method further includes receiving address information of the memory cell for discriminating the state of the cell after the cell voltage refresh command is received.

The address information is address information of a memory cell, address information of a page, or address information of a memory cell block.

As described above, a NAND flash memory device of the present invention detects a cell voltage shift generated in a process of maintaining a data program state for a certain time, and compensates the detected cell voltage shift. As a result, the cell distribution characteristic in the NAND flash memory device is improved.

DESCRIPTION OF SPECIFIC EMBODIMENTS

Hereinafter, the embodiments of the present invention will be explained in more detail with reference to the accompanying drawings.

Figure 3:
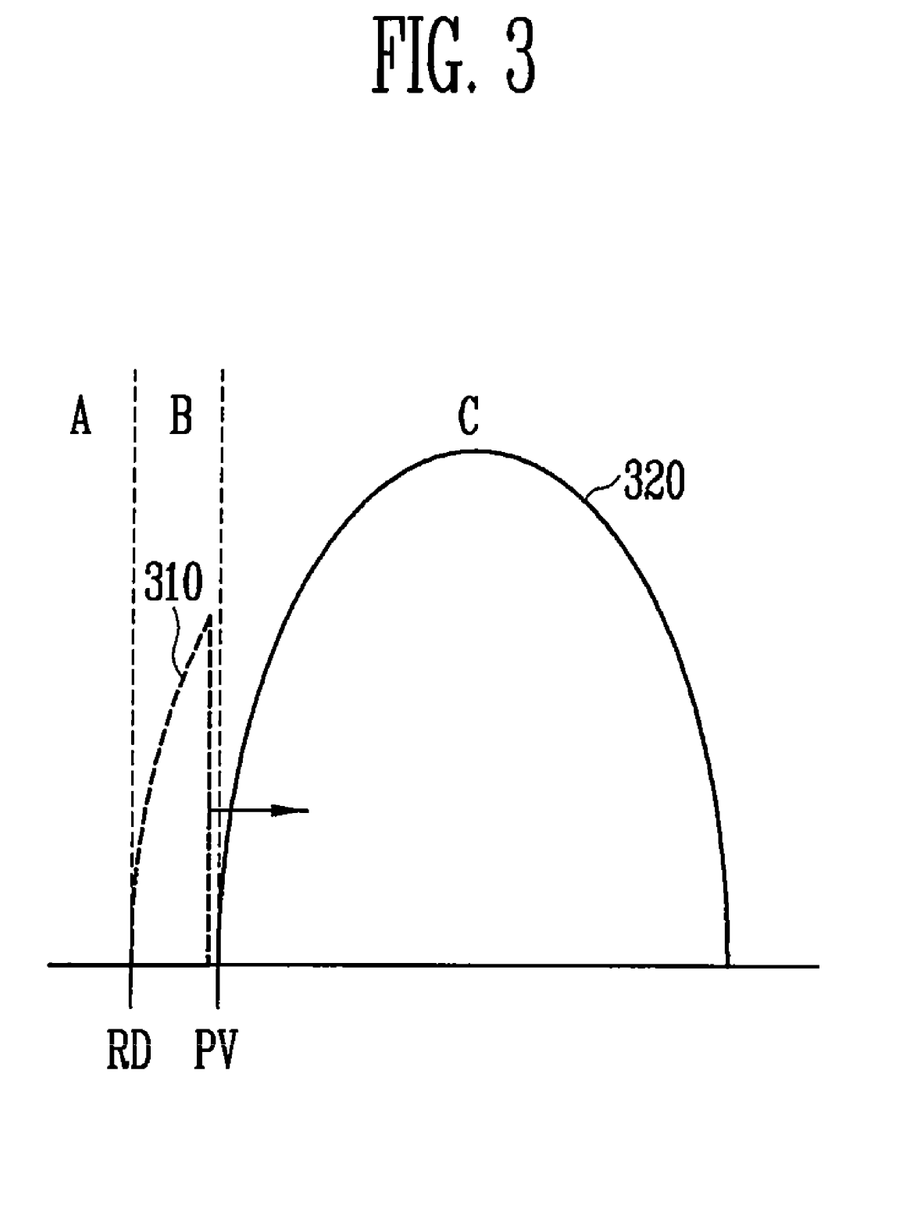
FIG. 3 is a view illustrating a cell distribution in accordance with the improvement of a cell characteristic in a NAND flash memory device according to one embodiment of the present invention.

FIG. 3 shows a part of the distribution of a cell where a cell voltage shift has occurred in accordance with a read voltage RD and a verifying voltage PV after data has been maintained for a certain time. Here, area C is an area where cells programmed normally are distributed. In addition, area B indicates an area where cells having shifted voltages are distributed, wherein the voltages of the cells are shifted from the normal area because the cells are maintained at the same state for more than a given time. Further, an area A means an area where cells that are not programmed are distributed.

Figure 4A:
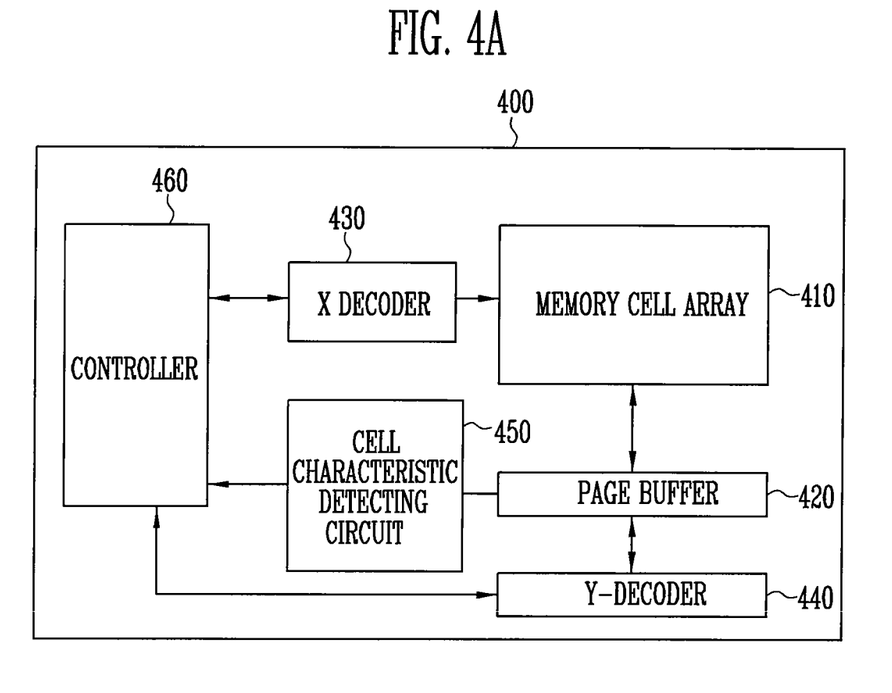
FIG. 4A is a block diagram illustrating the NAND flash memory device according to a first embodiment of the present invention.
Figure 5:
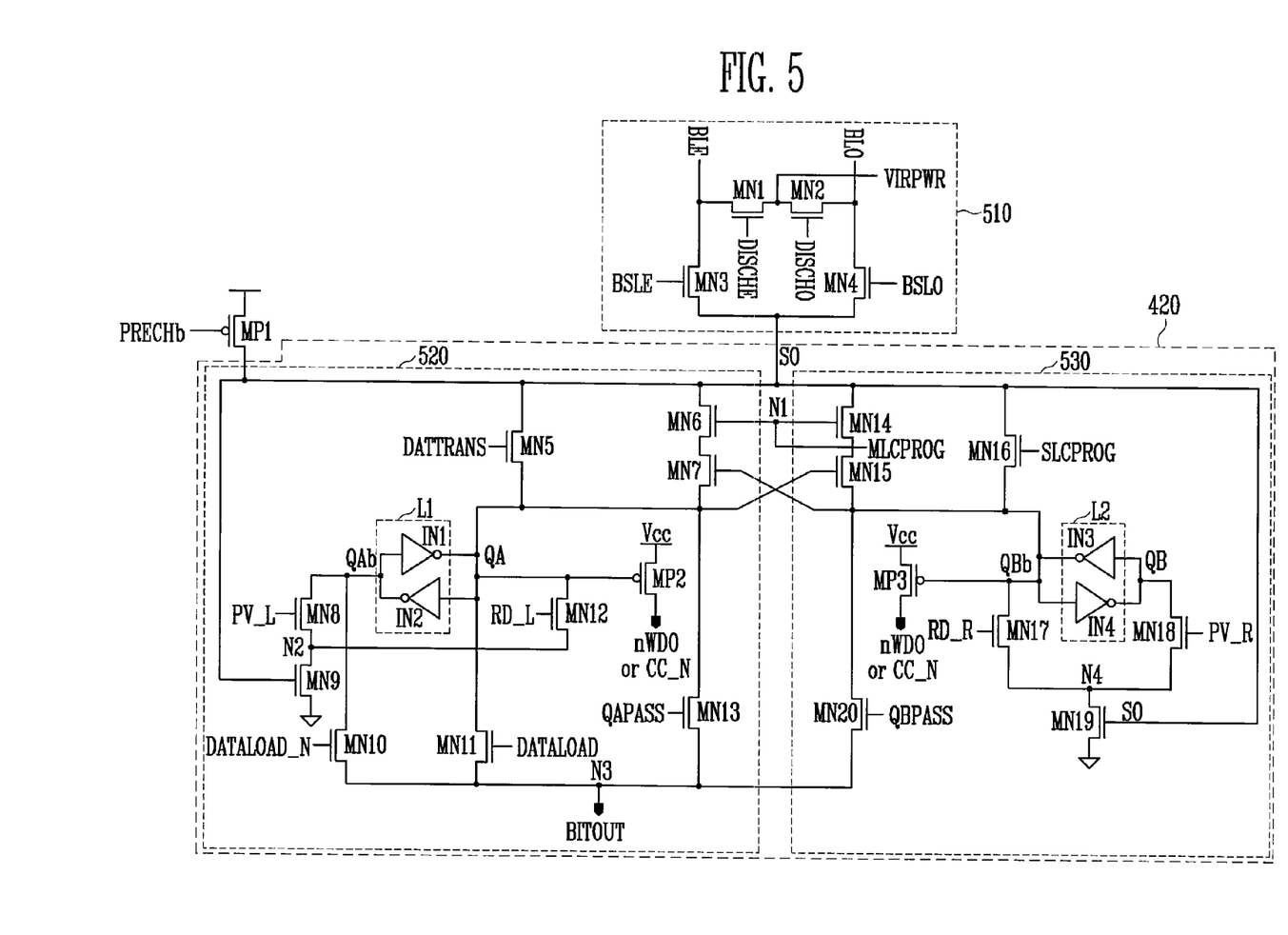
FIG. 5 is a view illustrating a circuitry of a page buffer included in a NAND flash memory device according to a second embodiment of the present invention.

In FIG. 4A, the NAND flash memory device of the first embodiment of the present invention includes a memory cell array 410 for storing data, a page buffer 420 for programming data in the memory cell array 410 or reading data from the memory cell array 410, an X decoder 430 and a Y decoder 440 for selecting a memory cell of the memory cell array 410 in accordance with an inputted address, a cell characteristic detecting circuit 450 for detecting a program state of a memory cell, coupled to a sensing node SO of FIG. 5 of the page buffer 420, and a controller 460 for controlling error correction in accordance with a cell characteristic detection result outputted from the cell characteristic detecting circuit 450.

The cell characteristic detecting circuit 450 outputs a sequence Seq. signal in accordance with a sensing node of the page buffer 420 and an area (where area is one of the areas A, B and C in FIG. 3) of a memory cell selected by using a program voltage and a read voltage.

In case that the memory cell is included in the area B in FIG. 3, the controller 460 reprograms a corresponding memory cell in accordance with the sequence signal.

Hereinafter, the constitution of the cell characteristic detecting circuit 450 will be described in detail with reference to FIG. 4B.

Figure 4B:
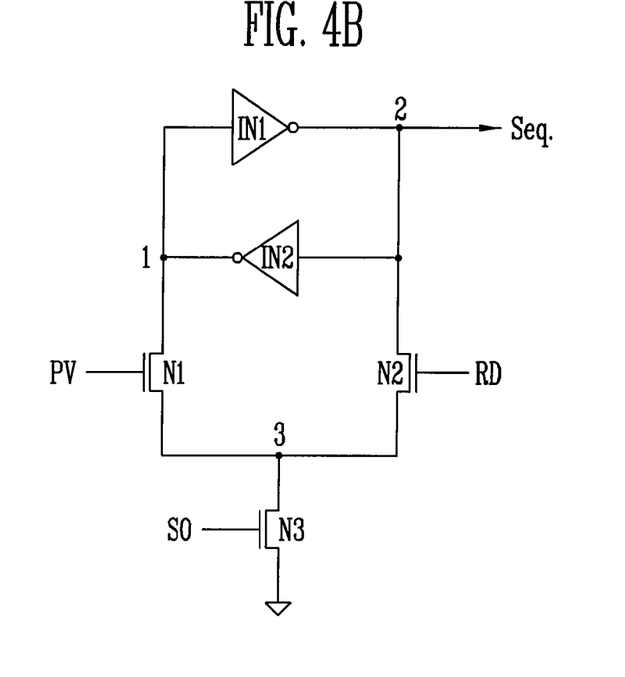
FIG. 4B is a view illustrating a circuitry of the cell characteristic detecting circuit in FIG. 4A.

FIG. 4B shows the circuit for detecting the state of cells so that the cells in the area B of FIG. 3 are shifted into the area C by reprogramming the cells.

The cell characteristic detecting circuit 450 according to one embodiment of the present invention includes first and second inverters IN1, IN2, and first to third N-MOS transistors N1 to N3.

The first inverter IN1 and second inverter IN2 are coupled between a first node 1 and a second node 2. The output of the first inverter IN1 is connected to the input of the second inverter IN2 and the output of the second inverter IN2 is connected to the input of the first inverter IN1 to form a latch circuit.

The first N-MOS transistor N1 is provided between the first node 1 and a third node 3. Here, a program verifying voltage PV is provided to a gate of the first N-MOS transistor N1.

Additionally, the second N-MOS transistor N2 is provided between the second node 2 and the third node 3. Here, a read voltage RD is provided to a gate of the second N-MOS transistor N2.

Further, the third N-MOS transistor N3 is coupled between the third node 3 and a ground voltage. Here, a gate of the third N-MOS transistor N3 is coupled to the sensing node SO between a memory cell (not shown) and a page buffer (not shown).

The output of the first inverter IN1 (i.e., the signal of the second node 2) is used as the sequence Seq. signal providing information concerning a state of a memory cell.

Hereinafter, an operation of the cell characteristic detecting circuit of the present invention will be described in detail.

The cell characteristic detecting circuit 450 performs a characteristic detection on a memory cell after the cell maintains the same state for a certain period of time, and reprograms a memory cell when a cell voltage shift is generated.

To detect the characteristic of the memory cell, the flash memory device turns on the third N-MOS transistor N3 by precharging the sensing node SO, and turns on the first N-MOS transistor N1 by applying the program verifying voltage PV The first node 1 is set low L and the signal of the second node 2 (i.e. the sequence signal) is reset high H accordingly as the first and third N-MOS transistors N1, N3 are turned on.

In case that the read voltage RD is applied to the second N-MOS transistor N2, the second node remains high H in a programmed cell. However, the second node 2 goes low L in an erased cell.

In particular, no current is passed to the sensing node SO in case of the programmed cell, and so the sensing node SO has a floating state. As a result, the third N-MOS transistor N3 is turned off, and so the second node 2 remains high H (i.e., remains at initial state even though the second N-MOS transistor N2 is turned on by the read voltage RD).

However, a certain current is passed to the sensing node SO in the case of the erased cell, and so the third N-MOS transistor N3 is turned on. Accordingly, the second node 2 goes low L when the second N-MOS transistor N2 is turned on by the read voltage RD.

In the case that the memory cell has normal state in accordance with the signal of the second node 2 (i.e., the sequence signal), the area A corresponds to an erased cell on the basis of the read voltage RD, and the areas B and C correspond to a programmed cell on the basis of the read voltage RD. Accordingly, the second node 2 is low L.

When the program verifying voltage PV is again applied, the second node 2 goes high H in the case of a cell in the area C. In addition, a cell in the area B is perceived as the erased cell, and so the second node 2 is low L.

Accordingly, in the case that it is discriminated that a cell is included in the area B, the cell is programmed again so that the cell in the area B is shift into the area C.

Table 1 shown below is a verifying table for assisting to discriminate an area of a cell by using a state of the sequence Seq. in accordance with the read voltage RD and the program verifying voltage PV.

TABLE 1

|       | A | B | C |
|-------|---|---|---|
| reset | H | H | H |
| RD    | H | L | L |
| PV    | H | L | H |

As shown in the Table 1, the sequence Seq. is initialized to be high H under the condition of a reset. Then, the area A maintains high level H by the read voltage RD, and the areas B and C are converted into low level L by the read voltage RD.

In case that the program verifying voltage PV is applied in order to separate the areas B and C, the cell in the area B remains low L, and the cell in the area C goes high H.

Cells where the sequence Seq. is low L after the read voltage RD and the program verifying voltage PV are applied are programmed again, and so the cell is shifted into the area C. As a result, the characteristic of the cell is improved, and so an error by the cell voltage shift can be corrected.

In brief, the cell characteristic detecting circuit 450 detects a state of each of memory cells using the read voltage RD and the program verifying voltage PV. Then, the flash memory device reprograms a cell where the characteristic has been deteriorated, and so the characteristic of the cell is improved.

In another embodiment of the present invention, the flash memory device does not have the cell characteristic detecting circuit, but detects a state of a cell using the page buffer, and then improves the characteristic of the cell.

Referring to FIG. 5, the page buffer included in the NAND flash memory device of an embodiment of the present invention includes a bit line selecting circuit 510, a first latch section 520 and a second latch section 530.

The bit line selecting circuit 510 selects an even bit line or an odd bit line in accordance with an inputted address, and includes a first N-MOS transistor MN1 to a fourth N-MOS transistor MN4.

The first latch section 520 has a fifth N-MOS transistor MN5 to a thirteenth N-MOS transistor MN13, a first and second inverter IN1, IN2, and a second P-MOS transistor MP2.

The second latch section 530 includes a fourteenth N-MOS transistor MN14 to a twentieth N-MOS transistor MN20, a third and fourth inverter IN3, IN4, and a third P-MOS transistor MP3.

The page buffer has a first P-MOS transistor MP1 for precharging. The first P-MOS transistor MP1 is coupled between the sensing node SO and a power supply voltage, and precharges the sensing node SO in response to a precharge signal PRECHb.

The bit line selecting circuit 510, the first latch section 520 and the second latch section 530 are coupled to the sensing node SO.

Hereinafter, the first latch section 520 will be described in detail.

The fifth N-MOS transistor MN5 is coupled between the sensing node SO and a node QA, and operates in response to a data transmission signal DATTRANS.

The sixth N-MOS transistor MN6 and the seventh N-MOS transistor MN7 are coupled in series between the sensing node SO and the A node QA.

The sixth N-MOS transistor MN6 operates in accordance with a multi-level cell program signal MLCPROG.

The seventh N-MOS transistor MN7 operates in accordance with a B inverting node QBb of the second latch section 530.

The first and second inverters IN1, IN2 form a first latch L1, and are coupled between the A node QA and an A inverting node QAb.

The second P-MOS transistor MP2 operates in accordance with the A node QA, and outputs a data verifying signal nWDO or a cell characteristic detection inverting signal CC_N.

The eighth N-MOS transistor MN8 and the ninth N-MOS transistor MN9 are coupled in series between the A inverting node QAb and the ground voltage. Here, the eighth N-MOS transistor MN8 operates in response to a left program voltage PV_L, and the ninth N-MOS transistor MN9 operates in accordance with the sensing node SO.

The tenth N-MOS transistor MN10 is coupled between the A inverting node QAb and the third node N3, and operates in accordance with a data input inverting signal DATA-LOAD_N.

The eleventh N-MOS transistor MN11 is coupled between the A node QA and a node N3, and operates in accordance with a data inputting signal DATALOAD.

The twelfth N-MOS transistor MN12 is coupled between the A node QA and the second node N2, and operates in accordance with a left read voltage RD_N.

The thirteenth N-MOS transistor MN13 is coupled between the A node QA and the third node N3, and operates in response to a passing signal QAPASS. This transistor is for outputting data of the first latch L1.

The first latch L1, the eighth N-MOS transistor MN8, the twelfth N-MOS transistor MN12 and the ninth N-MOS transistor MN9 may operate as a circuit for detecting the characteristic of a cell in accordance with a Vt refresh command inputted to a controller (not shown) in the NAND flash memory device.

Hereinafter, the constitution of the second latch section 530 will be described in detail.

The fourteenth N-MOS transistor MN14 and the fifteenth N-MOS transistor MN15 are coupled in series between the sensing node SO and the B inverting node QBb.

The fourteenth N-MOS transistor MN14 operates in accordance with the multi-level cell program MLCPROQ and the fifteenth N-MOS transistor MN15 operates in accordance with the A node QA.

The sixteenth N-MOS transistor MN16 is coupled between the sensing node SO and the B inverting node QBb, and operates in accordance with a single level cell program signal SLCPROG The third and fourth inverters IN3, IN4 form a second latch L2 coupled between the B node QB and the B inverting node QBb.

The third P-MOS transistor MP3 outputs the power supply voltage to the verifying signal nWDO or the cell characteristic inverting signal CC_N in accordance with the B inverting node QBb.

The seventh N-MOS transistor MN17 is coupled between the B inverting node QBb and a fourth node N4, and operates in accordance with a write reading voltage RD_R.

The eighteenth N-MOS transistor MN18 is coupled between the B node QB and the fourth node N4, and operates in accordance with a right verifying voltage PV_R.

The nineteenth N-MOS transistor MN19 is coupled between the fourth node N4 and the ground voltage, and operates in accordance with the sensing node SO.

The second latch L2, the seventeenth N-MOS transistor MN17, the eighteenth N-MOS transistor MN18 and the nineteenth N-MOS transistor MN19 may operate as a circuit for detecting the characteristic of a cell in accordance with the Vt refresh command inputted to the controller in the NAND flash memory device.

That is, each of the latch sections 520 and 530 of the page buffer has a circuit for detecting the characteristic of the cell.

The NAND flash memory device having the above page buffer detects the characteristic of the cell in accordance with the Vt refresh command inputted from an outside circuit (not shown), and improves the threshold voltage of the shift cell in accordance with the detection result.

Here, the detection of the characteristic of the cell may be performed in a unit of a page, or a unit of a block of the memory cell array, or a unit of a cell, in accordance with the inputted address.

Hereinafter, the operation of the cell characteristic circuit included in the page buffer will be described in detail. Here, the cell characteristic circuit included in the first latch section 510 will be described as an example of the cell characteristic circuit in the page buffer with reference to the cell distribution in FIG. 3.

To detect the characteristic of the cell in accordance with the inputted Vt refresh command, the NAND flash memory device of the present embodiment turns on the first P-MOS transistor MP1 by applying the precharge signal PRECHb=low to the page buffer, thereby precharging the sensing node SO to the power supply voltage.

The NAND flash memory device sets the left verifying voltage PV_L high, thereby resetting the A inverting node QAb to low. In this case, the A node QA is high accordingly as the B inverting node QBb is low, and so the P-MOS transistor MP2 is turned off. As a result, the cell characteristic inverting signal CC_N is low.

A cell selected in accordance with the inputted address is coupled through the bit line selecting section 510, and is read by the left read voltage RD_L.

In this case, the twelfth N-MOS transistor MN12 is turned on by the left read voltage RD_L. In addition, the sensing node SO maintains a precharged high in the case that the cell is programmed, and so the ninth N-MOS transistor MN9 is turned on. Accordingly, the A node QA goes low, and thus the second P-MOS transistor MP2 is turned on. As a result, the cell characteristic inverting signal CC_N is high.

If the cell characteristic inverting signal CC_N is high in accordance with the left read voltage RD_L, the cells corresponding to the cell characteristic inverting signal CC_N are programmed in response to the read voltage RD_L. Hence, the cells are included in the areas B and C.

Since the sensing node SO goes low in the case of the cells not programmed, the ninth N-MOS transistor MN9 is turned off. Therefore, the A node QA remains high level in its entirety, and so the cell characteristic inverting signal CC_N remains low.

The left verifying voltage PV_L is used so as to divide the areas B and C distributed by the left read voltage RD_L.

In other words, for a cell in the areas B and C, the A node QA and the A inverting node QAb are low and high by the left read voltage RD_L, respectively. Here, in case that a reading operation about the left verifying voltage PV_L is again performed, the cell in the area B about the left verifying voltage PV_L is perceived as a cell not programmed, and the cell in the area C is perceived as a cell programmed.

That is, in the case of the cell in the area B, the ninth N-MOS transistor MN9 is turned off according to the sensing node SO going low, and so the voltage level of the A inverting node QAb is not changed. Accordingly, the A node QA remains continuously low, and the cell characteristic inverting signal CC_N is high.

However, in case of the cell in the area C, the sensing node SO remains high and the ninth N-MOS transistor MN9 is turned on, and so the A inverting node QAb and the A node QA are goes low and high, respectively. As a result, the second P-MOS transistor MP2 is turned off, and so the cell characteristic inverting signal CC_N is low.

The cell verified as a cell in the area B in accordance with the cell characteristic circuit is programmed again in response to the program voltage, and so the cell in the area B is shifted into the area C. As a result, the characteristic of the cell may be improved.

Figure 6:
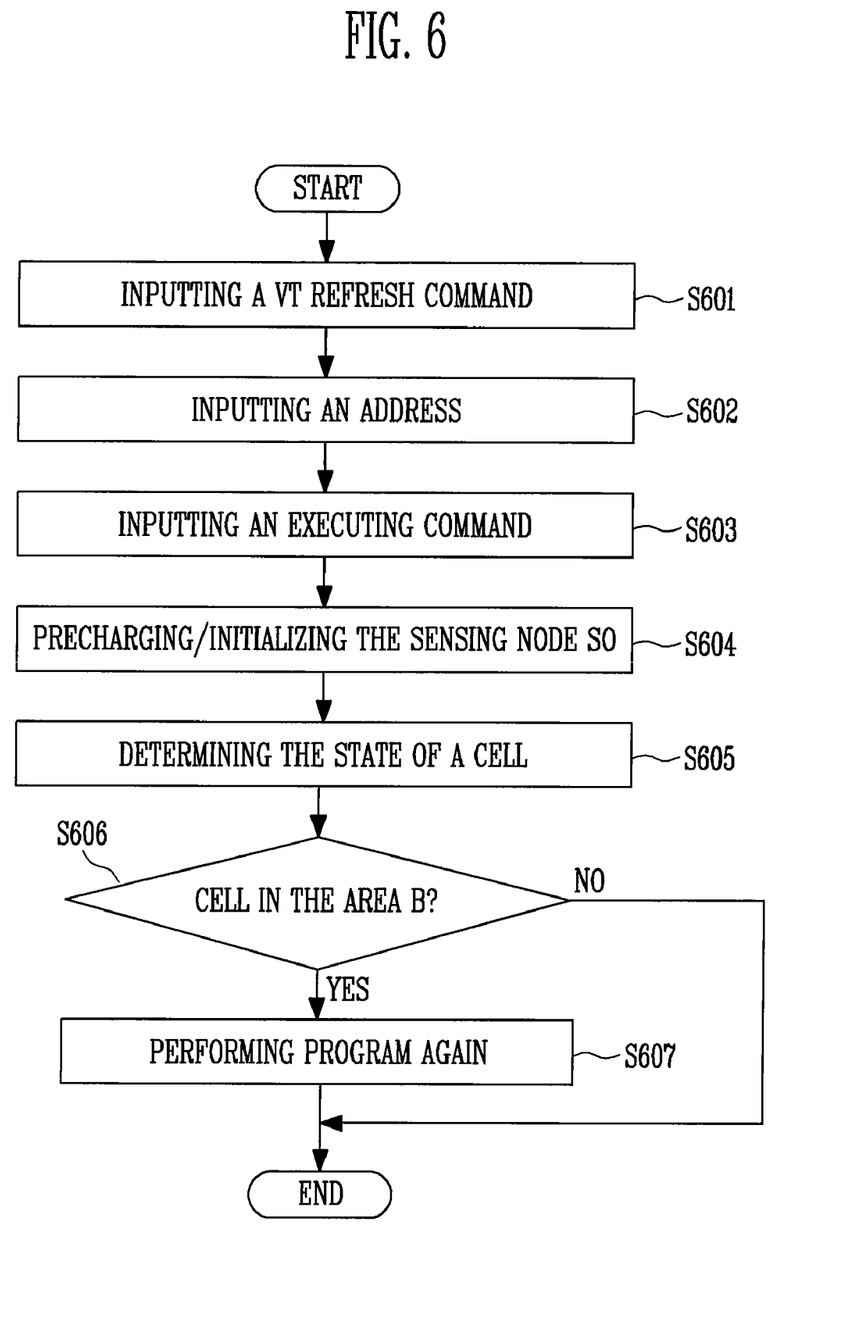
FIG. 6 is a flow chart illustrating a method of improving the characteristic of the cell in the NAND flash memory device according to the second embodiment of the present invention.

FIG. 6 is a flow chart illustrating a method of improving the characteristic of the cell in the NAND flash memory device according to the second embodiment of the present invention.

Referring to FIG. 6, the NAND flash memory device receives the Vt refresh command so as to improve the characteristic of the cell in step S601, and receives an address and an executing command in steps S602 and S603.

In this case, in the NAND flash memory device of the second embodiment, the controller operates in response to the Vt refresh command, and controls the cell characteristic detecting circuit of the page buffer as described above.

The address in the step S602 is an address of a specific cell, an address of the block, or an address of the page, etc. Hence, the NAND flash memory device may select a cell in a unit of the cell, the block, or the page, and so the characteristic of the cell may be improved.

In step S604, the sensing node SO is precharged in accordance with the Vt refresh command, and a sensing detecting circuit is initialized. Here, a method of initializing the sensing detecting circuit sets the A inverting node QAb to low level by applying the left verifying voltage PV_L in the case of the first latch section 520 as described above. In addition, in the case of the second latch section 530, the B node QB is set low by applying the right verifying voltage PV_R.

The state of the cell is determined in accordance with the verifying voltage PV and the read voltage RD in step S605, and then the cell in the area B is programmed again in steps S606 and S607.

The NAND flash memory device of the second embodiment improves the characteristic of the cell without additional circuits.

In addition, the cell characteristic detecting circuit may operate periodically during the flash memory device is operated, or may operate after the flash memory device is baked. Further, the NAND flash memory device may be operated in accordance with the needs of a user.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
   a memory cell array having a plurality of memory cells;
   a page buffer configured to program data to a selected memory cell or read data from the selected memory cell; and
   a cell characteristic detecting circuit coupled to a sensing node of the page buffer, and configured to output a control signal in accordance with a distribution state of the memory cell using a read voltage and a program voltage of the selected memory cell,
   wherein the selected memory cell is programmed by using the program voltage corresponding to a program verifying voltage in accordance with the control signal outputted from the cell characteristic verifying circuit.

2. The memory device of claim 1, wherein the cell characteristic verifying circuit determines whether or not the memory cell has been programmed properly by using the read voltage and the program verifying voltage in accordance with a level state of the memory cell, the memory device further comprising:
   an X decoder configured to select a word line of the memory cell array in accordance with an inputted address; and
   a Y decoder configured to provide a path to input data in the selected memory cell or output data from the selected memory cell, or both.

3. The memory device of claim 1, wherein the cell characteristic detecting circuit operates is configured to operate periodically.

4. The memory device of claim 1, wherein the cell characteristic detecting circuit operates after the memory device has been baked, wherein the memory device is a NAND flash memory device.

5. The memory device of claim 1, wherein the cell characteristic detecting circuit includes:
- a first transistor configured to read data from the sensing node by using the read voltage;
- a second transistor configured to read data from the sensing node in accordance with the program verifying voltage; and
- a latch circuit configured to perform a latch operation in accordance with a data state in the memory cell coupled to the sensing node, the latch operation being performed using the first transistor and the second transistor,
- wherein the memory device is a NAND flash memory device.

6. The memory device of claim 5, wherein the latch circuit includes a first inverter and a second inverter coupled between a first node and a second node, wherein a voltage level of the second node is outputted as the control signal.

7. The memory device of claim 6, wherein the first transistor is provided between the first node and a third node, and the second transistor is provided between the second node and the third node, and
- wherein the cell characteristic detecting circuit further includes a third transistor coupled between the third node and the ground, and configured to operate in accordance with a voltage level of the sensing node.

8. The memory device of claim 1, wherein a corresponding memory cell is reprogrammed if the corresponding memory cell has been programmed on the basis of the read voltage and has not been programmed on the basis of the program verifying voltage in accordance with the control signal outputted from the cell characteristic verifying circuit.

9. A NAND flash memory device comprising:
- a memory cell array having a plurality of memory cells; and
- a page buffer having a first latch section and a second latch section for sensing a voltage of a sensing node in response to a read control signal, storing and outputting the sensed data, or storing inputted data and outputting the store data through the sensing node, and determining a program state of a cell in accordance with a control signal;
- wherein a most significant bit register or a least significant bit register of the page buffer detects characteristic of the cell in accordance with a cell characteristic refresh command, and outputs a signal in accordance with the detection result.

10. The NAND flash memory device of claim 9, wherein the first latch section or the second latch section includes:
- a latch circuit coupled between a first node and a second node;
- a first transistor provided between the first node and a third node, and configured to read data coupled to the sensing node in accordance with a read voltage;
- a second transistor provided between the second node and the third node, and configured to read data from the sensing node in accordance with a program verifying voltage;
- a third transistor provided between the third node and a ground voltage, and configured to operate in accordance with a voltage level of the sensing node; and
- a fourth transistor configured to output a cell characteristic detecting signal in accordance with a voltage level of the second node.

11. The NAND flash memory device of claim 10, the first latch section further includes:
- a data inputting circuit coupled to the first node and the second node, and configured to perform an operation on inputting data; and
- an outputting circuit configured to output the data stored in the latch circuit to the sensing node.

12. The NAND flash memory device of claim 10, wherein the second latch section further includes:
- an outputting circuit configured to output data stored in the latch circuit to the sensing node.

13. The NAND flash memory device of claim 9, wherein the page buffer further includes:
- a bit line selecting circuit configured to select a bit line in accordance with the inputted address;
- a comparing circuit configured to determining whether or not a corresponding cell is programmed by comparing the data of the first latch section with the data of the second latch section, and perform a program operation in accordance with the result determined; and
- a precharge circuit configured to precharge the sensing node.

14. A method for operating a NAND flash memory device having a plurality of memory cells, the method comprising:
- receiving a cell voltage refresh command;
- determining a state of a selected cell in accordance with a read voltage and a verifying voltage; and
- reprogramming the selected cell the result determined indicates the cell is in an undesired state.

15. The method of claim 14, wherein the state of the cell includes:
- a first state indicates that a cell is not programmed about the read voltage;
- a second state indicates that a cell is programmed about the read voltage, and is not programmed about the verifying voltage; and
- a third state indicates that a cell is programmed about the read voltage and the verifying voltage.

16. The method of claim 15, wherein the cell having the second state is reprogrammed.

17. The method of claim 16, wherein the cell having the second state is reprogrammed using the verifying voltage.

18. The method of claim 14, further comprising:
- receiving address information of the memory cell for determining the state of the cell after the cell voltage refresh command is received.

19. The method of claim 18, wherein the address information is address information of a memory cell, address information of a page, or address information of a memory cell block.

* * * * *